US011841387B2

(12) United States Patent
Liu et al.

(10) Patent No.: US 11,841,387 B2
(45) Date of Patent: Dec. 12, 2023

(54) CLOUD-END COLLABORATIVE SYSTEM AND METHOD FOR LOAD IDENTIFICATION

(71) Applicants: CHINA ELECTRIC POWER RESEARCH INSTITUTE, Beijing (CN); STATE GRID CORPORATION OF CHINA, Beijing (CN)

(72) Inventors: Xingqi Liu, Beijing (CN); Enguo Zhu, Beijing (CN); Heping Zou, Beijing (CN); Fantao Lin, Beijing (CN); Min Lei, Beijing (CN); Yinghui Xu, Beijing (CN); Hao Chen, Beijing (CN); Zhongxing Wu, Beijing (CN); Yupeng Zhang, Beijing (CN); Zixu Zhu, Beijing (CN); Yue Han, Beijing (CN)

(73) Assignees: CHINA ELECTRIC POWER RESEARCH INSTITUTE, Beijing (CN); STATE GRID CORPORATION OF CHINA, Beijing (CN)

( * ) Notice: Subject to any disclaimer, the term of this patent is extended or adjusted under 35 U.S.C. 154(b) by 0 days.

(21) Appl. No.: 17/759,769
(22) PCT Filed: Jan. 29, 2022
(86) PCT No.: PCT/CN2022/075039
§ 371 (c)(1),
(2) Date: Jul. 29, 2022
(87) PCT Pub. No.: WO2022/111741
PCT Pub. Date: Jun. 2, 2022

(65) Prior Publication Data
US 2023/0070173 A1 Mar. 9, 2023

(30) Foreign Application Priority Data
Nov. 30, 2020 (CN) .......................... 202011395279.X

(51) Int. Cl.
*G01R 19/25* (2006.01)
*G16Y 10/35* (2020.01)
(52) U.S. Cl.
CPC .......... *G01R 19/2513* (2013.01); *G16Y 10/35* (2020.01)

(58) Field of Classification Search
CPC ... G01R 19/2513; G01R 21/133; Y04S 10/50; G16Y 10/35
(Continued)

(56) References Cited

U.S. PATENT DOCUMENTS
2020/0311598 A1 10/2020 Cmielowski et al.

FOREIGN PATENT DOCUMENTS
CN 105186693 A 12/2015
CN 106124852 A 11/2016
(Continued)

OTHER PUBLICATIONS
International Search Report in the international application No. PCT/CN2022/075039, dated Apr. 12, 2022.
(Continued)

*Primary Examiner* — John H Le
(74) *Attorney, Agent, or Firm* — SYNCODA LLC; Feng Ma

(57) ABSTRACT

A system for load identification in collaboration with a cloud end includes: a smart Internet of Things electricity meter module, used for matching extracted feature quantity data with a first load feature library of the smart Internet of Things electricity meter module, and determining load feature data corresponding to unmatched feature quantity data in the feature quantity data as target load feature data; a use information front-end/acquisition module, used for calling the target load feature data and transmitting the target load feature data to a main station load identification module; and a main station load identification module, used for receiving the target load feature data, performing data direction processing on the target load feature data, determining an optimal matching strategy matching the feature data to be
(Continued)

identified, and identifying an optimal matching solution corresponding to the feature quantity data to be identified in a second load feature library.

9 Claims, 6 Drawing Sheets

(58) Field of Classification Search
USPC .......................................................... 702/60
See application file for complete search history.

(56) References Cited

FOREIGN PATENT DOCUMENTS

| | | | | |
|---|---|---|---|---|
| CN | 109001528 A | 12/2018 | | |
| CN | 109870600 A | 6/2019 | | |
| CN | 110672934 A | 1/2020 | | |
| CN | 111830345 A | 10/2020 | | |
| CN | 112051462 A | * 12/2020 | ............. | G01R 31/00 |
| CN | 112560908 A | 3/2021 | | |

OTHER PUBLICATIONS

Tian, Xin et al. "Development and Application of New Intelligent Ammeter based on Multi-layer Cooperative Load Identification Technology", (Power Systems and Big Data), vol. 23, No. 8, Aug. 31, 2020 (Aug. 31, 2020), ISSN: 2096-4633,sections 1-4.

Zeifman, Michael et al. "Nonintrusive Appliance Load Monitoring: Review and Outlook", "IEEE Transactions on Consumer Electronics ", vol. 57, No. 1, Feb. 21, 2011 (Feb. 21, 2011),sections I-V.

* cited by examiner

CLOUD-END COLLABORATIVE SYSTEM AND METHOD FOR LOAD IDENTIFICATION

CROSS-REFERENCE TO RELATED APPLICATIONS

This application is a U.S. national stage of International Application No. PCT/CN2022/075039 filed on Jan. 29, 2022, which claims priority to Chinese patent application No. 202011395279.X, filed on Nov. 30, 2020. The disclosures of these applications are hereby incorporated by reference in their entirety.

TECHNICAL FIELD

The present disclosure relates to the technical field of load identification, and in particular to a cloud-end collaborative system and method for load identification.

BACKGROUND

In a related art, the types of user electrical devices that can be identified by a local load characteristic library in a load identification device are limited. In fact, there are many types of user electrical devices, the local load characteristic library cannot be updated in time after deployment, only part of electrical devices can be identified. Moreover, when users access a new device, it is often impossible to conduct correct identification, which brings great limitations to the usage scenarios of the device. Therefore, it is necessary to consider adopting a method to solve the problem of online identification of a local load identification device.

SUMMARY

Embodiments of the present disclosure expect to provide a cloud-end collaborative load identification system and method.

According to a first aspect, the embodiments of the present disclosure provide a cloud-end collaborative load identification system, which may include an intelligent Internet-of-Things watt-hour meter module, a user power information pre-loading/acquisition module, and a master station load identification module.

The intelligent Internet-of-Things watt-hour meter module is configured to identify load characteristic data of a user electrical device, perform characteristic vector data extraction on the load characteristic data by a preset load characteristic vector extraction algorithm, match extracted characteristic vector data with a first load characteristic library of the intelligent Internet-of-Things watt-hour meter module, and determine load characteristic data corresponding to characteristic vector data that is not matched in the extracted characteristic vector data as target load characteristic data.

The user power information pre-loading/acquisition module is configured to call the target load characteristic data and transmit the target load characteristic data to the master station load identification module.

The master station load identification module is configured to receive the target load characteristic data, perform data orientation processing on the target load characteristic data to obtain to-be-identified characteristic vector data and identify a target intelligent Internet-of-Things watt-hour meter module and a type of a target load characteristic extraction algorithm from the to-be-identified characteristic vector data; and store matching information and determine an optimal matching strategy matching the to-be-identified characteristic data when it is determined that the target load characteristic extraction algorithm matches the target intelligent Internet-of-Things watt-hour meter module, and identify an optimal matching solution corresponding to the to-be-identified characteristic vector data from a second load characteristic library according to the optimal matching strategy, to complete a matching between the to-be-identified characteristic vector data and the second load characteristic library. According to a second aspect, the embodiments of the present disclosure further provide a cloud-end collaborative load identification method, which may include the following operations.

An intelligent Internet-of-Thing watt-hour meter module identifies load characteristic data of a user electrical device, performs characteristic vector data extraction on the load characteristic data by a preset load characteristic vector extraction algorithm, matches extracted characteristic vector data with a first load characteristic library of the intelligent Internet-of-Things watt-hour meter module, and determines load characteristic data corresponding to the characteristic vector data that is not matched in the extracted characteristic vector data as target load characteristic data.

A user power information pre-loading/acquisition module calls the target load characteristic data and transmits the target load characteristic data to a master station load identification module.

The master station load identification module receives the target load characteristic data, performs data orientation processing on the target load characteristic data to obtain to-be-identified characteristic vector data, and identifies a target intelligent Internet-of-Things watt-hour meter module and a type of a target load characteristic extraction algorithm from the to-be-identified characteristic vector data; and stores matching information and determine an optimal matching strategy matching the to-be-identified characteristic data when it is determined that the target load characteristic extraction algorithm matches the target intelligent Internet-of-Things watt-hour meter module, and identifies an optimal matching solution corresponding to the to-be-identified characteristic vector data from a second load characteristic library according to the optimal matching strategy, to complete a matching between the to-be-identified characteristic vector data and the second load characteristic library. The intelligent Internet-of-Things watt-hour meter module is configured to identify load characteristic data of a user electrical device, perform characteristic vector data extraction on the load characteristic data by a preset load characteristic vector extraction algorithm, match extracted characteristic vector data with a first load characteristic library of the intelligent Internet-of-Things watt-hour meter module, and determine load characteristic data corresponding to the characteristic vector data that is not matched in the extracted characteristic vector data as target load characteristic data.

The user power information pre-loading/acquisition module is configured to call the target load characteristic data and transmit the target load characteristic data to the master station load identification module.

The master station load identification module is configured to receive the target load characteristic data, perform data orientation processing on the target load characteristic data to obtain to-be-identified characteristic vector data and identify a target intelligent Internet-of-Things watt-hour meter module and a type of a target load characteristic extraction algorithm from the to-be-identified characteristic vector data; and store matching information and determine an optimal matching strategy matching the to-be-identified characteristic data when it is determined that the target load characteristic extraction algorithm matches the target intelligent Internet-of-Things watt-hour meter module, and identify an optimal matching solution corresponding to the to-be-identified characteristic vector data from a second load characteristic library according to the optimal matching strategy, to complete the matching between the to-be-identified characteristic vector data and the second load characteristic library. In the embodiments of the present disclosure, the load characteristic data corresponding to the characteristic vector data (unidentifiable), which is not matched by the intelligent Internet-of-Things watt-hour meter module, is determined as the target load characteristic data. The target load characteristic data is transmitted to the master station load identification module through the user power information pre-loading/acquisition module, and the target load characteristic data is identified by the master station load identification module. First, the to-be-identified characteristic vector data is acquired through target load characteristic data. Then, the optimal matching solution corresponding to the to-be-identified characteristic vector data is determined. Therefore, online identification of unknown device functions by a load identification device such as a local intelligent Internet-of-Things watt-hour meter module may be implemented, and the load identification capability of the device is strengthened.

BRIEF DESCRIPTION OF THE DRAWINGS

The drawings herein are incorporated into and constitute a part of the specification, which illustrate embodiments in accordance with the present disclosure and together with the specification are used to explain the technical solutions of the present disclosure.

DETAILED DESCRIPTION

Figure 1:
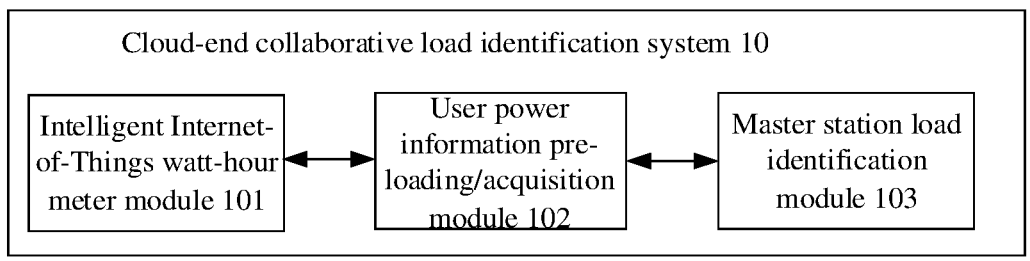
FIG. 1 is a structural composition diagram of a cloud-end collaborative load identification system according to an embodiment of the present disclosure.

Now, the exemplary implementation modes of the present application are described with reference to the drawings. However, the present application may be implemented in many different forms and is not limited to the embodiments described herein. These embodiments are provided to fully and completely disclose the present application and fully convey the scope of the present application to those skilled in the art. Terms illustrated in the exemplary implementation modes in the drawings do not limit the present disclosure. In the drawings, the same reference signs are used for the same units/elements.

Unless otherwise defined, terms used herein (including scientific and technological terms) have common understanding meanings for those skilled in the art. In addition, it is to be understood that terms defined by commonly used dictionaries should be understood to have the same meaning as the context of related fields thereof rather than being understood as idealized or too formal.

Load identification of resident-side electrical devices is an important research direction of smart grid. For electrical devices for users, there are features such as many kinds of electrical devices, large scale of a device, and great differences in load characteristics of respective devices. At present, mainstream watt-hour meters installed at the user's side only achieve the function of measuring the total electricity consumption, but not the function of measuring electricity consumption in classification according to the nature of the electrical devices. When the detailed information of household energy efficiency composition can be analyzed, energy-saving suggestions can be put forward for the electricity consumption period and electricity consumption composition of each electrical device, so that users can know the energy consumption status of specific electrical devices in time, thus guiding users to take energy-saving measures independently, reducing electricity expenses for users, effectively reducing energy consumption and unreasonable waste, and achieving energy-saving and consumption-reducing effects. Therefore, the resident user load identification technology has important research significance.

Load identification is generally divided into an intrusive load identification technology and a non-intrusive load identification technology. The intrusive load identification technology needs to be measured separately for each type of load or key electrical devices of users. The manner needs to install a large number of hardware devices, consumes a lot of costs in installation, maintenance, information processing and other aspects, and has poor economic benefits, which is an important reason for difficulty in popularization on a large scale.

The non-intrusive load identification method only needs to install a device with load identification at the user's general electricity meter to collect electricity consumption data such as voltage and current, and perform load identification based on a local identification algorithm and a load characteristic library, so as to analyze the state of all loads in a family. The manner does not need hardware installation and maintenance, reduces the cost and is easier to implement.

At present, with the pilot and popularization of load identification for resident users, many local-side load identification devices been deployed in resident users' families. In actual use, it is found that the load identification device generally needs to go through a sample data training or learning process in advance. Some algorithms are inefficient, and the real-time performance of load identification is difficult to guarantee. It is difficult to find an algorithm to accurately identify each electrical appliance due to the wide variety of electrical devices and complex working conditions. The performance of the device is limited, the local load characteristic library cannot be updated in time after deployment, only part of electrical devices can be identified, and when users access a new device, it is often impossible to conduct correct identification, which brings great limitations to the usage scenarios of the device, so it is necessary to consider adopting a method to solve the problem of online identification and synchronization of the local load identification device.

Based on the technical problem, the embodiments of the present disclosure provide a cloud-end collaborative load identification system. As illustrated in FIG. 1, the cloud-end collaborative load identification system 10 includes an intelligent Internet-of-Things watt-hour meter module 101, a user power information pre-loading/acquisition module 102, and a master station load identification module 103.

The intelligent Internet-of-Things watt-hour meter module 101 is configured to identify load characteristic data of a user electrical device, perform characteristic vector data extraction on the load characteristic data by a preset load characteristic vector extraction algorithm, match the extracted characteristic vector data with a first load characteristic library of the intelligent Internet-of-Things watt-hour meter module, and determine the load characteristic data corresponding to the characteristic vector data that is not matched in the extracted characteristic vector data as target load characteristic data.

The user power information pre-loading/acquisition module 102 is configured to call the target load characteristic data and transmit the target load characteristic data to the master station load identification module 103.

The master station load identification module 103 is configured to receive the target load characteristic data, perform data orientation processing on the target load characteristic data to obtain to-be-identified characteristic vector data, and identify a target intelligent Internet-of-Things watt-hour meter module and a type of a target load characteristic extraction algorithm from the to-be-identified characteristic vector data; and store the matching information and determine an optimal matching strategy matching the to-be-identified characteristic data when it is determined that the target load characteristic extraction algorithm matches the target intelligent Internet-of-Things watt-hour meter module, and identify an optimal matching solution corresponding to the to-be-identified characteristic vector data from a second load characteristic library according to the optimal matching strategy, to complete the matching between the to-be-identified characteristic vector data and the second load characteristic library.

It is to be understood that the intelligent Internet-of-Things watt-hour meter module 101 is a device with a load identification function installed at the user's watt-hour meter. The master station load identification module 103 is equipment or a device for user load identification at the cloud side.

In some possible implementation modes, the intelligent Internet-of-Things watt-hour meter module 101 may include at least two non-intrusive load identification modules with the function of identifying the load of the user electrical device.

In one implementation mode, the first load characteristic library includes a personalized load characteristic library and a general load characteristic library. The general load characteristic library may include a sub-general load characteristic library in each non-intrusive load identification module in the intelligent Internet-of-Things watt-hour meter module 101. The personalized load characteristic library may include a sub-personalized load characteristic library in each non-intrusive load identification module in the intelligent Internet-of-Things watt-hour meter module 101. Herein, the general load characteristic library is configured to record the characteristic vector data of at least two types of user electrical devices, and the personalized load characteristic library is configured to record the characteristic vector data corresponding to the optimal matching solution.

It is to be understood that the target load characteristic data may include unmatched to-be-identified characteristic vector data obtained by performing data orientation processing on the target load characteristic data, and at least include a target energy Internet-of-Things watt-hour meter module and a type of a target load characteristic extraction algorithm which correspond to the matched characteristic vector data.

In some implementation modes, the operation of performing data orientation processing on the target load characteristic data to obtain the to-be-identified characteristic vector data may be that data cleaning, garbage screening and other functions are performed on the target load characteristic data, and the characteristic vector data corresponding to the target load characteristic data is identified as the to-be-identified characteristic vector data through a load characteristic vector identification algorithm at the cloud side.

In the embodiment of the present disclosure, the load characteristic data corresponding to the characteristic vector data (unidentifiable) that is not matched by the intelligent Internet-of-Things watt-hour meter module is determined as the target load characteristic data, and the target load characteristic data is transmitted to the master station load identification module through the user power information pre-loading/acquisition module, and the target load characteristic data is identified by the master station load identification module. Firstly, the to-be-identified characteristic vector data is acquired through target load characteristic data, and then the optimal matching solution corresponding to the to-be-identified characteristic vector data is determined. Therefore, the function of online identifying an unknown device functions by a load identification device such as a local intelligent Internet-of-Things watt-hour meter module may be implemented, and the load identification capability of the device is strengthened.

It is to be understood that the master station load identification module is further configured to input the characteristic vector data corresponding to the optimal matching solution to the first load characteristic library after the matching between the to-be-identified characteristic vector data and the second load characteristic library is completed.

It can be seen that the unknown device identified online may be synchronized to the load characteristic library in the device identified by local users, since the characteristic vector data corresponding to the optimal matching solution is input to the first load characteristic library.

Figure 2:
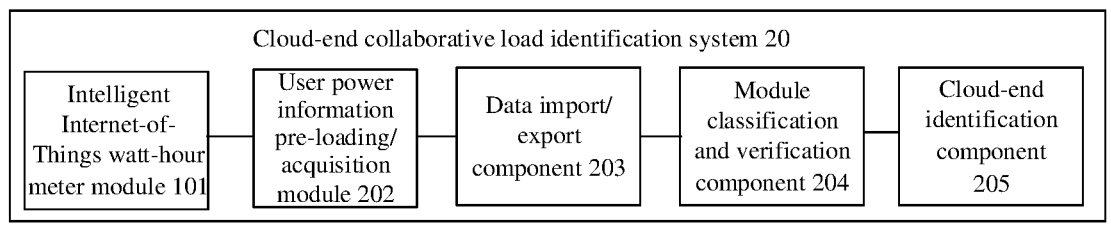
FIG. 2 is a structural composition diagram of another cloud-end collaborative load identification system according to an embodiment of the present disclosure.

FIG. 2 is a structural composition diagram of another cloud-end collaborative load identification system according to an embodiment of the present disclosure. As illustrated in FIG. 2, the cloud-end collaborative load identification system 20 includes: an intelligent Internet-of-Things watt-hour meter module 201, a user power information pre-loading/acquisition module 202, a data import/export component 203, a module classification and verification component 204, and a cloud-end identification component 205.

The intelligent Internet-of-Things watt-hour meter module 201 is configured to identify load characteristic data of a user electrical device, perform characteristic vector data extraction on the load characteristic data by a preset load characteristic vector extraction algorithm, match the extracted characteristic vector data with a first load characteristic library of the intelligent Internet-of-Things watt-hour meter module, and determine the load characteristic data corresponding to the characteristic vector data that is not matched in the extracted characteristic vector data as target load characteristic data.

The user power information pre-loading/acquisition module 202 is configured to call the target load characteristic data and transmit the target load characteristic data to the data import/export component 203.

The data import/export component 203 is configured to receive the target load characteristic data.

The module classification and verification component 204 is configured to perform data orientation processing on the target load characteristic data to obtain the to-be-identified characteristic vector data, and identify the target intelligent Internet-of-Things watt-hour meter module and the type of the target load characteristic extraction algorithm from the to-be-identified characteristic vector data.

The cloud-end identification component 205 is configured to store the matching information and determine the optimal matching strategy matching the to-be-identified characteristic vector data when it is determined that the target load characteristic extraction algorithm matches the target intelligent Internet-of-Things watt-hour meter module, and identify an optimal matching solution corresponding to the to-be-identified characteristic vector data from the second load characteristic library according to the optimal matching strategy, to complete the matching between the to-be-identified characteristic vector data and the second load characteristic library.

In the embodiment of the present disclosure, the target load characteristic data is received by the data import/export component, data orientation processing is performed on the target load characteristic data by the module classification and verification component to obtain the to-be-identified characteristic vector data, and the target intelligent Internet-of-Things watt-hour meter module and the type of the target load characteristic extraction algorithm are identified. Finally, in the case that the target load characteristic extraction algorithm is determined to be matched with the target intelligent Internet-of-Things watt-hour meter module, the cloud identification component stores the matching information and determines the optimal matching strategy that matches the to-be-identified characteristic vector data, and according to the optimal matching strategy, identifies the optimal matching solution corresponding to the to-be-identified characteristic vector data from the second load characteristic library, so that the unknown device functions may be identified online by the load identification device at the cloud side, and the load identification capability of the device is strengthened.

Figure 3:
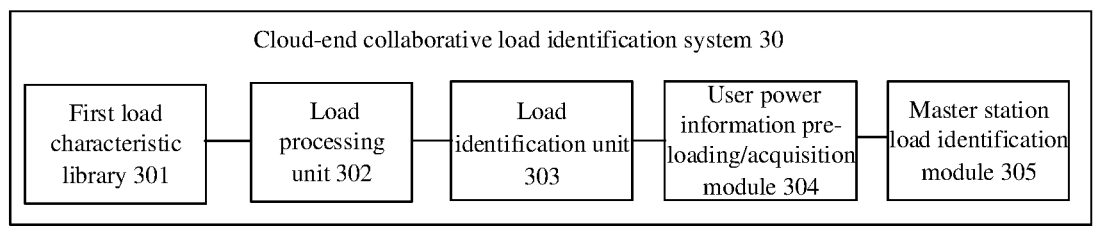
FIG. 3 is a structural composition diagram of yet another cloud-end collaborative load identification system according to an embodiment of the present disclosure.

FIG. 3 is a structural composition diagram of yet another cloud-end collaborative load identification system according to an embodiment of the present disclosure. As illustrated in FIG. 3, the cloud-end collaborative load identification system 30 includes: a first load characteristic library 301, a load processing unit 302, a load identification unit 303, a user power information pre-loading/acquisition module 304, and a master station load identification module 305.

The first load characteristic library 301 is configured to record the load characteristic vector data of at least two types of user electrical devices and the characteristic vector data corresponding to the optimal matching solution.

The load processing unit 302 is configured to collect and process power information data at the user side in real time to obtain change values of voltage and current of each user electrical device, determine the start-up time point of the user electrical device and the time interval of the load at a transient stage and steady stage according to the sampled change values of voltage and current, and identify the load characteristic data of the user electrical device according to the time interval.

The load identification unit 303 is configured to extract characteristic vector data of the load characteristic data based on the preset load characteristic vector extraction algorithm, match the extracted characteristic vector data with the first load characteristic library, and determine the load characteristic data corresponding to the characteristic vector data, that has been determined not to be matched, in the extracted characteristic vector data as the target load characteristic data.

The user power information pre-loading/acquisition module 304 is configured to call the target load characteristic data and transmit the target load characteristic data to the master station load identification module 305.

The master station load identification module 305 is configured to receive the target load characteristic data, perform data orientation processing on the target load characteristic data to obtain to-be-identified characteristic vector data and identify a target intelligent Internet-of-Things watt-hour meter module and a type of a target load characteristic extraction algorithm from the to-be-identified characteristic vector data; and store the matching information and determine an optimal matching strategy matching the to-be-identified characteristic data in the case that it is determined that the target load characteristic extraction algorithm matches the target intelligent Internet-of-Things watt-hour meter module, and identify an optimal matching solution corresponding to the to-be-identified characteristic vector data from a second load characteristic library according to the optimal matching strategy, to complete the matching between the to-be-identified characteristic vector data and the second load characteristic library.

In some possible implementation modes, the intelligent Internet-of-Things watt-hour meter module includes at least two non-intrusive load identification modules. The personalized load characteristic library includes at least two sub-personalized characteristic libraries corresponding to each non-intrusive load identification module. The general load characteristic library includes at least two sub-general characteristic libraries corresponding to each non-intrusive load identification module.

Each of the sub-general characteristic libraries is configured to record the characteristic vector data of at least one type of user electrical device in the corresponding non-intrusive load identification module.

Each of the sub-personalized characteristic libraries is configured to selectively record the characteristic vector data corresponding to the optimal matching solution.

In the embodiment of the present disclosure, the power information data of the user side is collected and processed in real time through the load processing unit to obtain the voltage and current change values of each user electrical device, the start-up time point of the corresponding device and the time interval of the load at the transient stage and steady stage are determined according to the sampled voltage and current change values, and the load characteristic data of the user electrical device is identified according to the time interval. The load characteristic data of at least one type of user electrical device and the characteristic vector data corresponding to the optimal matching solution are recorded by the first load characteristic library. Finally, the characteristic vector data in the load characteristic data is extracted by the load identification unit, the extracted characteristic vector data is matched with the first load characteristic library, and the load characteristic data corresponding to the characteristic vector data, that has been determined not to be matched, in the extracted characteristic vector data is determined as the target load characteristic data. Thus, each user may locally determine whether there is an unmatched or unidentified electrical device.

Figure 4:
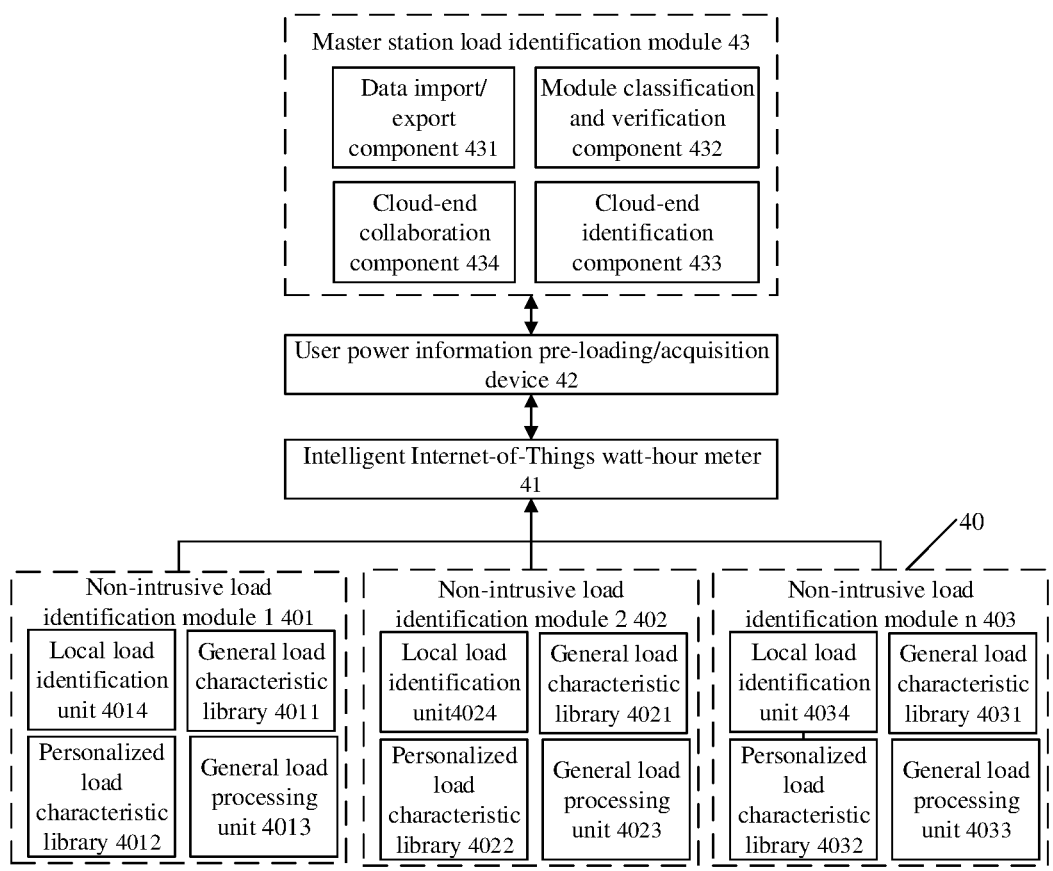
FIG. 4 is a structural composition diagram of still another cloud-end collaborative load identification system according to an embodiment of the present disclosure.

FIG. 4 is a structural composition diagram of still another cloud-end collaborative load identification system according to an embodiment of the present disclosure. As illustrated in FIG. 4, the cloud-end collaborative load identification system includes: an intelligent Internet-of-Things watt-hour meter module 40, an intelligent Internet-of-Things watt-hour meter 41, a user power information pre-loading/acquisition device 42 and a master station load identification module 43. Herein, the intelligent Internet-of-Things watt-hour meter module 40 includes a first non-intrusive load identification module 401, a second non-intrusive load identification module 402 and a n-th non-intrusive load identification module 403. The master station load identification module 43 includes a data import/export component 431, a module classification and verification component 432, a cloud-end identification component 433 and a cloud-end collaboration component 434.

The components of the first non-intrusive load identification module 401, the second non-intrusive load identification module 402 and the n-th non-intrusive load identification module 403 are the same. Here, only the components of the first non-intrusive load identification module 401 will be described.

The first non-intrusive load identification module 401 includes a general load characteristic library 4011, a personalized load characteristic library 4012, a general load processing unit 4013 and a local load identification unit 4014.

In FIG. 4, the intelligent Internet-of-Things watt-hour meter module 40 is connected with the intelligent Internet-of-Things watt-hour meter 41. The intelligent Internet-of-Things watt-hour meter module 40 acquires load characteristic data (voltage and voltage data) through the intelligent Internet-of-Things watt-hour meter 41, determines unidentified (unmatched) load characteristic data from the acquired load characteristic data, and outputs the unidentified load characteristic data to the intelligent Internet-of-Things watt-hour meter 41. The intelligent Internet-of-Things watt-hour meter 41 is connected with the user power information pre-loading/acquisition device 42. The user power information pre-loading/acquisition device 42 calls the unidentified load characteristic data in the intelligent Internet-of-Things watt-hour meter 41, and transmits the unidentified load characteristic data to the master station load identification module 43 connected with the user power information pre-loading/acquisition device 42. The master station load identification module 43 identifies the unidentified load characteristic data, obtains the optimal solution, and reversely transmits the optimal solution to the user power information pre-loading/acquisition device 42. The user power information pre-loading/acquisition device 42 transmits the optimal solution to the intelligent Internet-of-Things watt-hour meter 41. The intelligent Internet-of-Things watt-hour meter module 40 acquires the optimal solution in the intelligent Internet-of-Things watt-hour meter 41, and stores the characteristic vector corresponding to the optimal solution into the corresponding characteristic library in the intelligent Internet-of-Things watt-hour meter 41. In the embodiment of the present disclosure, the general load characteristic library 4011 is fixed local characteristic library information, which is used to record the load characteristic data of various types of user electrical devices.

The personalized load characteristic library 4012 is configured to record the matched user load characteristic data and device information.

The general load processing unit 4013 is configured to collect and process power information data at the user side in real time, determine a start-up time point of the device and the time interval of a load at a transient stage and steady stage according to the real-time sampled voltage and current change values for the device operation, and extract general load characteristic data.

The local load identification unit 4013 has a load characteristic vector extraction algorithm, and extracts characteristic vector information according to the load characteristic vector extraction algorithm, and matches the personalized load characteristic library or general load characteristic library. The module classification and verification component 432 implements the master station's functions of oriented processing of uploaded characteristic vector data, data cleaning, garbage screening, etc., and identifies the local load identification algorithm corresponding to the current module of the intelligent Internet-of-Things watt-hour meter. Different algorithms have personalized data processing strategies.

The cloud identification component 433 performs polling processing on an algorithm set owned by the master station. In the case that a certain algorithm has the type of load characteristic vector matching identification device, the current matching information is registered in an identification library. After polling the algorithm set of the master station, the cloud-end identification component identifies the optimal solution of the current identification library. The selection strategy of the optimal solution may be based on the priorities of the algorithms in the algorithm library, the most solutions of matching device types, and other methods. The matched characteristic vector information is distributed to the intelligent watt-hour meter through the cloud-end collaboration component, and the personalized characteristic library of the watt-hour meter is updated.

The data import/export component 431 is employed so that the master station load identification module 42 can import and export the characteristic vector library data and update the load identification algorithm, thus expanding the load identification capability of the master station.

The user power information pre-loading/acquisition device 42 is the device and service integrating communication network and data transmission, and may communicate with a collection information pre-loading service of the master station through Ethernet, a 4G wireless network and other networks, to exchange load identification characteristic vector data.

The intelligent Internet-of-Things watt-hour meter 41 is configured to collect voltage and current signals of the user electrical devices.

Herein, the first non-intrusive load identification module 401 or the second non-intrusive load identification module 402 are different non-intrusive load identification modules due to the differences between load identification algorithms of different manufacturers. However, only one type of non-intrusive load identification module is configured for each intelligent Internet-of-Things watt-hour meter.

The general load characteristic library 4011 is fixed local characteristic library data, which records the characteristic vector data of various types of devices. The general load characteristic library 4011 is generally fixed at the device operation stage. Due to the differences between the load identification algorithms of different equipment manufacturers, the general load characteristic libraries are different among different manufacturers' devices.

The personalized load characteristic library 4012 records the matched user characteristic vector and device information. After the device is installed at the user side, the device will analyze the load characteristics of the user electrical appliances and match the load identification characteristic vector, and further identify the electric device by the characteristic vector and a specific local algorithm matching. The current electric device and characteristic vector are stored in the personalized load characteristic library, so that the personalized load characteristic library 4012 can record the load identification characteristic library information of all the devices of the household users after running for a period of time.

The general load processing unit 4013 collects and processes the power information data at the user side in real time, determines the start-up time point of the device and the time interval of the load at the transient stage and steady stage according to the real-time sampled voltage and current change values for the device operation, and extracts general characteristic vector to submit to the master station for collaborative identification.

The local load identification unit 4013 has a load characteristic vector extraction algorithm. The characteristic vector data is extracted by the local load identification unit 4013, and is matched with the personalized load characteristic library 4012 or the general load characteristic library 4011. In case of local matching failure, the unit may collaborate with the master station for processing and match the characteristic vector data of the device with the assistance of the master station, and then the relevant electrical device information of the characteristic vector successfully matched by the master station is input to the personalized load characteristic library after being acquired.

Figure 5:
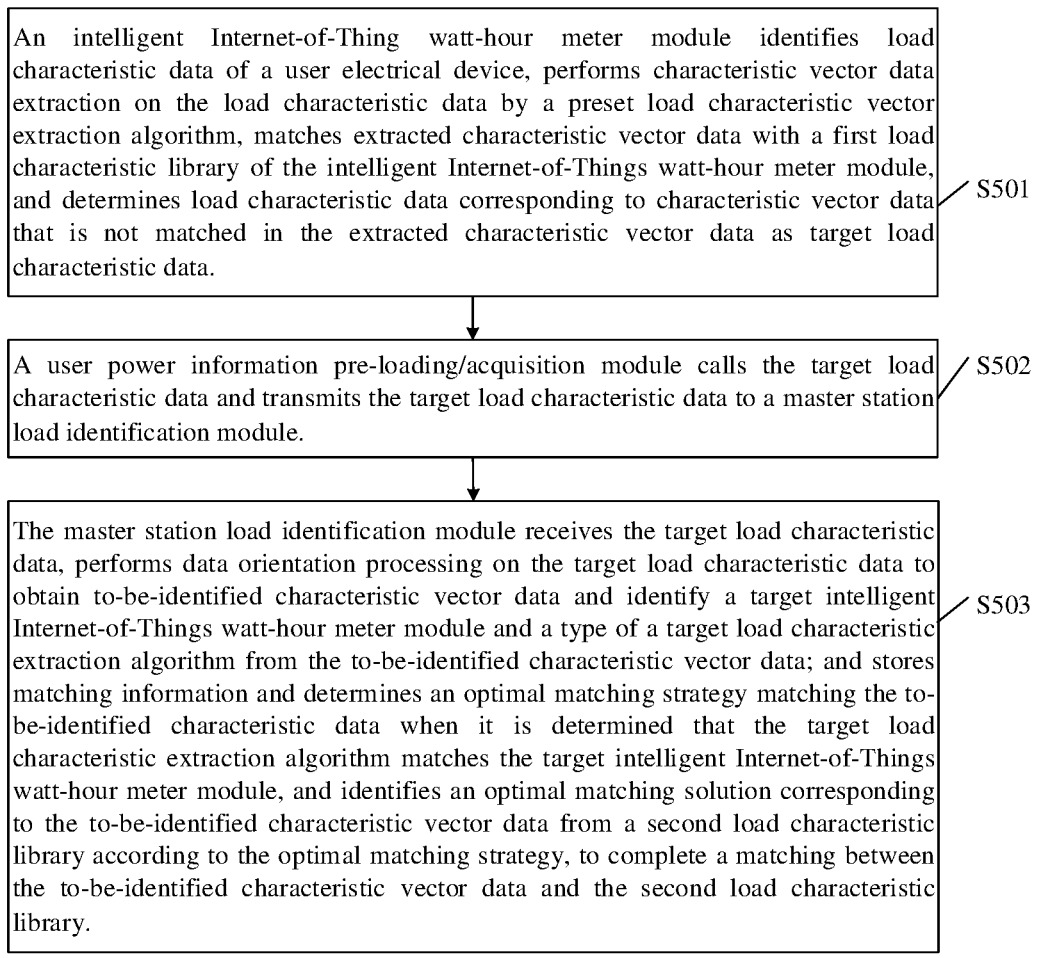
FIG. 5 is an implementation flowchart of a cloud-end collaborative load identification method according to an embodiment of the present disclosure.

Based on the above-mentioned embodiment, the embodiment of the present disclosure further provides a cloud-end collaborative load identification method. As illustrated in FIG. 5, the method includes the following operations.

At S501, an intelligent Internet-of-Thing watt-hour meter module identifies load characteristic data of a user electrical device, performs characteristic vector data extraction on the load characteristic data by a preset load characteristic vector extraction algorithm, matches the extracted characteristic vector data with a first load characteristic library of the intelligent Internet-of-Things watt-hour meter module, and determines the load characteristic data corresponding to the characteristic vector data that is not matched in the extracted characteristic vector data as target load characteristic data.

At S502, a user power information pre-loading/acquisition module calls the target load characteristic data and transmits the target load characteristic data to a master station load identification module.

At S503, the master station load identification module receives the target load characteristic data, performs data orientation processing on the target load characteristic data to obtain to-be-identified characteristic vector data, and identify a target intelligent Internet-of-Things watt-hour meter module and a type of a target load characteristic extraction algorithm from the to-be-identified characteristic vector data; and stores the matching information and determines an optimal matching strategy matching the to-be-identified characteristic data in the case that it is determined that the target load characteristic extraction algorithm matches the target intelligent Internet-of-Things watt-hour meter module, and identifies an optimal matching solution corresponding to the to-be-identified characteristic vector data from a second load characteristic library according to the optimal matching strategy, so as to complete the matching between the to-be-identified characteristic vector data and the second load characteristic library.

The embodiment of the present disclosure further provides a cloud-end collaborative load identification method, which includes the following operations.

At S60, an intelligent Internet-of-Thing watt-hour meter module identifies load characteristic data of a user electrical device, performs characteristic vector data extraction on the load characteristic data by a preset load characteristic vector extraction algorithm, matches the extracted characteristic vector data with a first load characteristic library of the intelligent Internet-of-Things watt-hour meter module, and determines the load characteristic data corresponding to the characteristic vector data that is not matched in the extracted characteristic vector data as target load characteristic data.

At S61, a user power information pre-loading/acquisition module calls the target load characteristic data and transmits the target load characteristic data to a master station load identification module.

At S62, the master station load identification module receives the target load characteristic data, performs data orientation processing on the target load characteristic data to obtain to-be-identified characteristic vector data, and identify a target intelligent Internet-of-Things watt-hour meter module and a type of a target load characteristic extraction algorithm from the to-be-identified characteristic vector data; and stores the matching information and determines an optimal matching strategy matching the to-be-identified characteristic data in the case that it is determined that the target load characteristic extraction algorithm matches the target intelligent Internet-of-Things watt-hour meter module, and identifies an optimal matching solution corresponding to the to-be-identified characteristic vector data from a second load characteristic library according to the optimal matching strategy, so as to complete the matching between the to-be-identified characteristic vector data and the second load characteristic library.

At S64, the characteristic vector data corresponding to the optimal matching solution is input to the second load characteristic library.

In some implementation modes, the first load characteristic library includes a personalized load characteristic library and a general load characteristic library. The method also includes that the sub-personalized load characteristic library records the characteristic vector data corresponding to the optimal matching solution.

Figure 6:
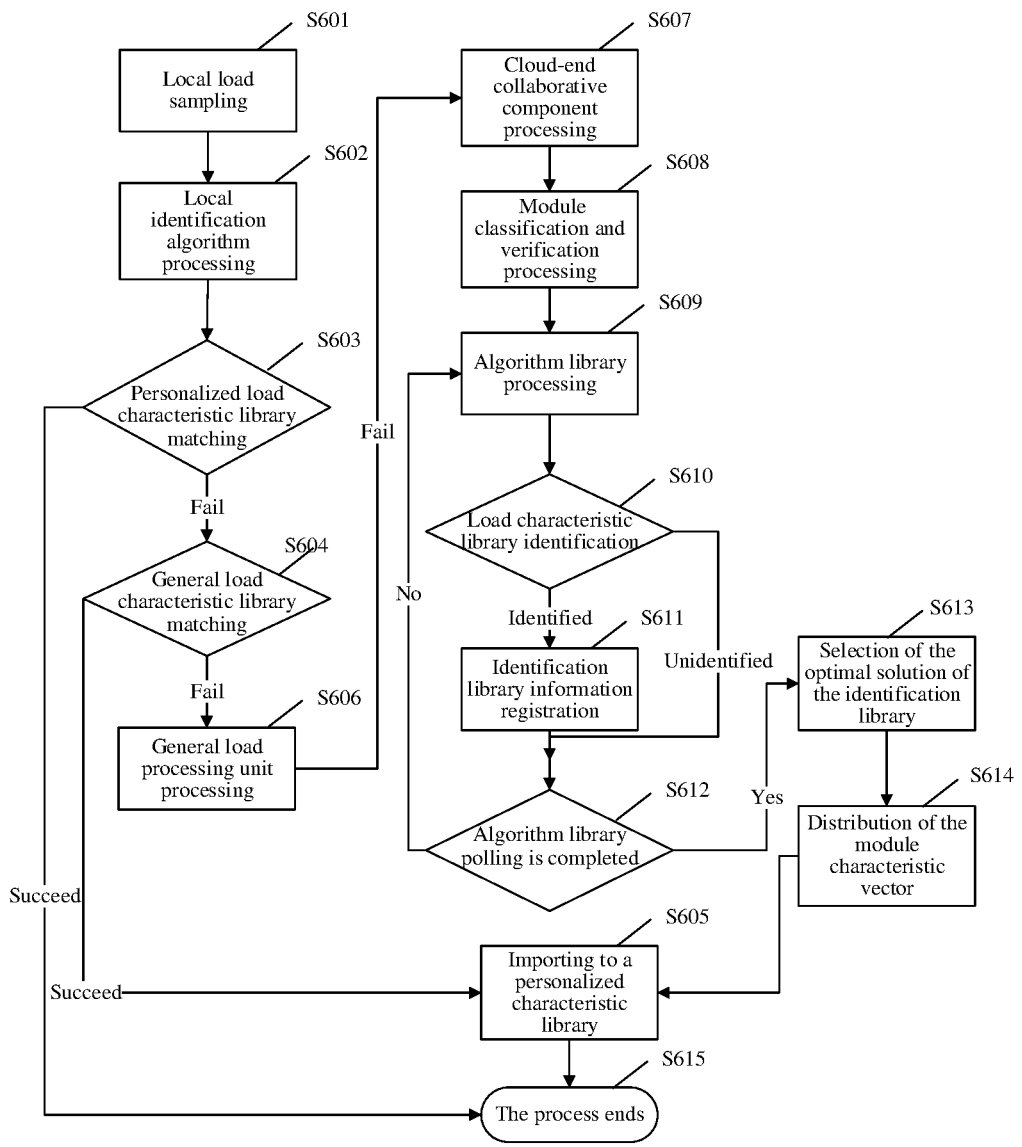
FIG. 6 is an implementation flowchart of a cloud-end collaborative load identification method according to an embodiment of the present disclosure.

FIG. 6 is an implementation flowchart of a cloud-end collaborative load identification method according to an embodiment of the present disclosure. As illustrated in FIG. 6, the method includes the following operations.

At S601, local load sampling is performed.

Here, the local load sampling may be that the intelligent Internet-of-Things watt-hour meter module collects the load characteristic data of local user electrical devices.

At S602, local identification algorithm processing is performed.

Here, the local identification algorithm processing may be that the intelligent Internet-of-Things watt-hour meter module performs characteristic extraction on the load characteristic data by a preset load characteristic extraction algorithm to obtain characteristic vector data.

At S603, personalized characteristic library matching is performed.

Here, the personalized load characteristic library matching may be that the extracted characteristic vector data and the personalized load characteristic library are matched, in the case that the matching succeeds, the process goes to S615, and if the matching fails, the process goes to S604.

At S604, general load characteristic library matching is performed.

Here, in S604, the extracted characteristic vector data may be matched with the general load characteristic library, if the matching succeeds, the process goes to S605, and if the matching fails, the process goes to S606.

At S605, importing to the personalized characteristic library is performed.

Here, S605 may be that the extracted characteristic vector data is imported to the personalized characteristic library, and then the process goes to S615.

At S606, general load processing unit processing is performed.

Here, S606 includes that: a general load processing unit analyzes and processes the data output at S601 mainly according to the data requirements of the master station load identification module, and enables the analyzed and processed data to pass identifiers (a software identifier and a hardware identifier) of a packaging module and algorithm to match the data requirements of S608 and S609.

At S607, cloud-end collaborative component processing is performed.

Here, the cloud collaborative component processing may be that a cloud collaborative component receives the load characteristic data and performs oriented processing on the load characteristic data to obtain the to-be-identified characteristic vector data.

At S608, module classification and verification processing is performed.

Here, S608 may be that the types of the target intelligent Internet-of-Things watt-hour meter module and the target load characteristic extraction algorithm are identified from the to-be-identified characteristic vector data, it is determined whether the target load characteristic extraction algorithm matches the target intelligent Internet-of-Things watt-hour meter module or not, and if yes, the process goes to S609.

At S609, algorithm library processing is performed.

Here, S609 may be that the algorithm library processing starts to be performed on the to-be-identified characteristic vector data, that is, one of the algorithms is selected from the algorithm library to start processing the characteristic vector data.

At S610, load characteristic library identification is performed.

Here, S610 may be that the to-be-identified characteristic vector data is identified using the load characteristic library of the master station, and in the case that the identification succeeds, the process goes to S611.

At S611, identification library information registration is performed.

Here, S611 includes that the identification result of identification by each algorithm in the algorithm library is registered.

At S612, algorithm library polling is completed.

Here, S612 includes that it is judged that each algorithm in the algorithm library has been polled. The process goes to S613 in the case that it is determined that each algorithm in the algorithm library has been polled. In the case that it is determined that the polling of each algorithm in the algorithm library has not been completed, the process goes to S609.

At S613, selection of the optimal solution of the identification library is performed.

Here, S613 may be that the optimal solution is selected from the identification results corresponding to each algorithm in the algorithm library.

At S614, the module characteristic vector is distributed.

Here, S614 may be that the selected optimal solution is distributed to the characteristic library of the module.

At S615, the process ends.

The embodiment of the present disclosure implements online identification of unknown device functions by a load identification device such as a local intelligent Internet-of-Things watt-hour meter and strengthens the load identification capability of the device.

Based on the strong computing power of the cloud, the embodiment of the present disclosure can reduce the performance and storage capacity requirements of the local load identification device, effectively reduce the hardware cost, and bring considerable economic benefits when the amount of devices is very large.

In the embodiment of the present disclosure, the master station concentrates massive load data, so that the load identification learning and algorithm research and improvement can be conducted more accurately, a virtuous circle is prone to forming, and the load identification capability of the master station is enhanced.

Those skilled in the art may understand that the embodiments of the present disclosure may be provided as methods, systems, or computer program products. Therefore, the present disclosure may adopt forms of complete hardware embodiments, complete software embodiments or embodiments integrating software and hardware. Moreover, the present disclosure may adopt the form of a computer program product implemented on one or more computer available storage media (including but not limited to a disk memory, a CD-ROM, an optical memory, etc.) containing computer available program codes. The solutions in the embodiments of the present disclosure may be implemented in various computer languages, such as object-oriented programming language Java and literal script language JavaScript.

The present disclosure is described with reference to flowcharts and/or block diagrams of the method, the device (system) and the computer program product according to the embodiments of the present disclosure. It should be understood that each flow and/or block in the flowchart and/or block diagram, and the combination of the flow and/or block in the flowchart and/or block diagram can be implemented by the computer program instructions. These computer program instructions can be provided to a processor of a general-purpose computer, a special-purpose computer, an embedded processor or other programmable data processing devices to generate a machine, so that instructions which are executed by the processor of the computer or other programmable data processing devices generate a device which is used for implementing the specified functions in one or more flows of the flowchart and/or one or more blocks of the block diagram.

These computer program instructions may also be stored in the computer-readable memory which can guide the computer or other programmable data processing devices to work in a particular way, so that the instructions stored in the computer-readable memory generate a product including an instruction device. The instruction device implements the specified functions in one or more flows of the flowchart and/or one or more blocks of the block diagram.

These computer program instructions may also be loaded on the computer or other programmable data processing devices, so that a series of operation steps are performed on the computer or other programmable data processing devices to generate the processing implemented by the computer, and the instructions executed on the computer or other programmable data processing devices provide the steps for implementing the specified functions in one or more flows of the flowchart and/or one or more blocks of the block diagram.

Although the preferred embodiments of the present disclosure have been described, those skilled in the art can make additional changes and modifications to these embodiments once they know the basic creative concepts. Therefore, the appended claims are intended to be interpreted to include the preferred embodiments and all changes and modifications that fall within the scope of the present disclosure.

It is apparent that those skilled in the art can make various changes and variations to the present disclosure without departing from the spirit and scope of the present disclosure. Thus, if these modifications and variations of the present disclosure fall within the scope of the claims of the present disclosure and their equivalents, the present disclosure is also intended to include these modifications and variations.

The invention claimed is:

1. A cloud-end collaborative system for load identification, comprising:
an intelligent Internet-of-Things watt-hour meter assembly, configured to identify load characteristic data of a user electrical device, perform characteristic vector data extraction on the load characteristic data by a preset load characteristic vector extraction algorithm, match extracted characteristic vector data with a first load characteristic library of the intelligent Internet-of-Things watt-hour meter assembly, and determine load characteristic data corresponding to characteristic vector data that is not matched in the extracted characteristic vector data as target load characteristic data;
a user power information pre-loading/acquisition assembly, configured to call the target load characteristic data and transmit the target load characteristic data to a master station load identification assembly; and
the master station load identification assembly, configured to receive the target load characteristic data, perform data orientation processing on the target load characteristic data to obtain to-be-identified characteristic vector data, and identify a target intelligent Internet-of-Things watt-hour meter assembly and a type of a target load characteristic extraction algorithm from the to-be-identified characteristic vector data; and store matching information and determine an optimal matching strategy matching the to-be-identified characteristic data when it is determined that the target load characteristic extraction algorithm matches the target intelligent Internet-of-Things watt-hour meter assembly, and identify an optimal matching solution corresponding to the to-be-identified characteristic vector data from a second load characteristic library according to the optimal matching strategy, to complete a matching between the to-be-identified characteristic vector data and the second load characteristic library.

2. The system of claim 1, wherein the master station load identification assembly is further configured to input characteristic vector data corresponding to the optimal matching solution to the second load characteristic library after completing the matching between the to-be-identified characteristic vector data and the second load characteristic library.

3. The system of claim 1, wherein the first load characteristic library comprises a personalized load characteristic library and a general load characteristic library, the general load characteristic library is configured to record characteristic vector data of at least two types of user electrical devices, and
the personalized load characteristic library is configured to record characteristic vector data corresponding to the optimal matching solution.

4. The system of claim 3, wherein the intelligent Internet-of-Things watt-hour meter assembly comprises:
the first load characteristic library, configured to record the load characteristic vector data of at least two types of user electrical devices and the characteristic vector data corresponding to the optimal matching solution;
a load processing device, configured to collect and process power information data at a user side in real time to obtain change values of voltage and current of each user electrical device, determine a start-up time point of the user electrical device and a time interval of a load at a transient stage and steady stage according to the sampled change values of voltage and current, and identify the load characteristic data of the user electrical device according to the time interval; and
a load identification device, configured to extract characteristic vector data of the load characteristic data based on the preset load characteristic vector extraction algorithm, match the extracted characteristic vector data with the first load characteristic library, and determine the load characteristic data corresponding to the characteristic vector data, that has been determined not to be matched, in the extracted characteristic vector data as the target load characteristic data.

5. The system of claim 4, wherein the intelligent Internet-of-Things watt-hour meter assembly comprises at least two non-intrusive load identification devices, the personalized load characteristic library comprises at least two sub-personalized characteristic libraries corresponding to each non-intrusive load identification device, and the general load characteristic library comprises at least two sub-general characteristic libraries corresponding to each non-intrusive load identification device,
each sub-general characteristic library is configured to record the characteristic vector data of at least two types of user electrical devices under the non-intrusive load identification device, and
each sub-personalized characteristic library is configured to selectively record the characteristic vector data corresponding to the optimal matching solution.

6. The system of claim 1, wherein the master station load identification assembly comprises:
a data import/export component, configured to receive the target load characteristic data;
a assembly classification and verification component, configured to perform data orientation processing on the target load characteristic data to obtain the to-be-identified characteristic vector data, and identify the target intelligent Internet-of-Things watt-hour meter assembly and the type of the target load characteristic extraction algorithm from the to-be-identified characteristic vector data;
a cloud-end identification component, configured to store the matching information and determine the optimal matching strategy matching the to-be-identified characteristic vector data when it is determined that the target load characteristic extraction algorithm matches the target intelligent Internet-of-Things watt-hour meter assembly, and identify an optimal matching solution corresponding to the to-be-identified characteristic vector data from the second load characteristic library according to the optimal matching strategy, to complete the matching between the to-be-identified characteristic vector data and the second load characteristic library; and the user power information pre-loading/acquisition assembly, configured to call the target load characteristic data and transmit the target load characteristic data to the data import/export component.

7. A cloud-end collaborative method for load identification, comprising:

identifying, by an intelligent Internet-of-Thing watt-hour meter assembly, load characteristic data of a user electrical device, performing characteristic vector data extraction on the load characteristic data by a preset load characteristic vector extraction algorithm, matching extracted characteristic vector data with a first load characteristic library of the intelligent Internet-of-Things watt-hour meter assembly, and determining load characteristic data corresponding to the characteristic vector data that is not matched in the extracted characteristic vector data as target load characteristic data;

calling, by a user power information pre-loading/acquisition assembly, the target load characteristic data and transmitting the target load characteristic data to a master station load identification assembly; and receiving, by the master station load identification assembly, the target load characteristic data, performing data orientation processing on the target load characteristic data to obtain to-be-identified characteristic vector data, and identifying a target intelligent Internet-of-Things watt-hour meter assembly and a type of a target load characteristic extraction algorithm from the to-be-identified characteristic vector data; and storing matching information and determining an optimal matching strategy matching the to-be-identified characteristic data when it is determined that the target load characteristic extraction algorithm matches the target intelligent Internet-of-Things watt-hour meter assembly, and identifying an optimal matching solution corresponding to the to-be-identified characteristic vector data from a second load characteristic library according to the optimal matching strategy, to complete a matching between the to-be-identified characteristic vector data and the second load characteristic library.

8. The method of claim 7, wherein the method further comprises: inputting, by the master station load identification assembly, characteristic vector data corresponding to the optimal matching solution to the second load characteristic library after completing the matching between the to-be-identified characteristic vector data and the second load characteristic library.

9. The method of claim 7, wherein the first load characteristic library comprises a personalized load characteristic library and a general load characteristic library, and the method further comprises:

recording, by the personalized load characteristic library, characteristic vector data corresponding to the optimal matching solution.

* * * * *